US012422519B2

(12) United States Patent
Bauernfeind et al.

(10) Patent No.: US 12,422,519 B2
(45) Date of Patent: *Sep. 23, 2025

(54) REAL-TIME CHIRP SIGNAL FREQUENCY LINEARITY MEASUREMENT

(71) Applicant: Infineon Technologies AG, Neubiberg (DE)

(72) Inventors: Thomas Bauernfeind, Arbing (AT); Andreas Schwarz, Öpping (AT); Nicolo Guarducci, Linz (AT); Thorsten Brandt, Paphos (CY); Francesco Lombardo, Munich (DE); Bernhard Greslehner-Nimmervoll, Hagenberg (AT); Daniel Maier, Schenkenfelden (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 320 days.

This patent is subject to a terminal disclaimer.

(21) Appl. No.: 18/066,029

(22) Filed: Dec. 14, 2022

(65) Prior Publication Data
US 2024/0077579 A1    Mar. 7, 2024

Related U.S. Application Data

(63) Continuation-in-part of application No. 17/903,238, filed on Sep. 6, 2022, now Pat. No. 12,249,998.

(51) Int. Cl.
*G01S 7/35* (2006.01)

(52) U.S. Cl.
CPC .................................. *G01S 7/352* (2013.01)

(58) Field of Classification Search
CPC .......... G01S 7/352; G01S 7/35; G01S 13/343; G01S 7/4008; H03L 7/06; H03L 7/0992; H03L 7/091

See application file for complete search history.

(56) References Cited

U.S. PATENT DOCUMENTS

| 9,774,336 | B2 * | 9/2017 | Liu | H03L 7/0991 |
| 10,097,187 | B2 * | 10/2018 | Doare | H03L 7/0814 |
| 10,727,848 | B2 * | 7/2020 | Dato | H03L 7/0992 |
| 2009/0262878 | A1 * | 10/2009 | Sun | H03L 7/085 |
| | | | | 375/376 |
| 2018/0181077 | A1 * | 6/2018 | Salle | G01S 7/032 |

* cited by examiner

*Primary Examiner* — Vladimir Magloire
*Assistant Examiner* — Yonghong Li
(74) *Attorney, Agent, or Firm* — Slater Matsil, LLP

(57) ABSTRACT

A frequency linearity measurement circuit configured to measure a frequency linearity of a frequency signal includes: a first measurement circuit configured to generate a first estimate of an integer number of clock cycles of the frequency signal within a respective gate signal period of a gate signal; a second measurement circuit comprising a time-to-digital converter (TDC) configured to generate a second estimate of a fractional number of clock cycle of the frequency signal within the respective gate signal period; a reference measurement circuit configured to generate a third estimate of an expected number of clock cycles within the respective gate signal period; and a closed-loop frequency tracking circuit configured to track a frequency error between an expected frequency and a measured frequency, where the expected frequency and the measured frequency are determined based on the third estimate and on a sum of the first estimate and the second estimate, respectively.

20 Claims, 14 Drawing Sheets

REAL-TIME CHIRP SIGNAL FREQUENCY LINEARITY MEASUREMENT

PRIORITY CLAIM AND CROSS-REFERENCE

This application is a continuation-in-part of U.S. patent application Ser. No. 17/903,238, filed Sep. 6, 2022 and entitled "Real-Time Chirp Signal Frequency Linearity Measurement," which application is incorporated herein by reference.

TECHNICAL FIELD

The present invention relates generally to systems and methods for measuring the linearity of the frequency of a chirp signal in, e.g., a frequency-modulated continuous-wave (FMCW) radar system.

BACKGROUND

Applications in the millimeter-wave frequency regime have gained significant interest in the past few years due to the rapid advancement in low cost semiconductor technologies such as silicon germanium (SiGe) and fine geometry complementary metal-oxide semiconductor (CMOS) processes. Availability of high-speed bipolar and metal-oxide semiconductor (MOS) transistors has led to a growing demand for integrated circuits for millimeter-wave applications at, e.g., 60 GHz, 77 GHz, and 80 GHz, or even beyond 100 GHz. Such applications include, for example, automotive radar systems and multi-gigabit communication systems.

Radar is used for different applications such as target identification/tracking, positioning, monitoring of physical conditions, or motion/gesture sensing. Radar systems using radio frequency integrated circuits (RFICs), such as monolithic microwave integrated circuits (MMICs), have been widely deployed in autonomous driving vehicles. In a frequency-modulated continuous-wave (FMCW) radar system, the transmitted RF signal includes a plurality of frames, where each frame includes a frequency ramp signal (also referred to as a chirp signal). The chirp signal is also used as a reference signal in the receiving path of the FMCW radar system. The frequency linearity of the chirp signal is important for the system performance of the FMCW radar system. There is a need in the art for circuitries that can provide a highly accurate frequency linearity measurement in real-time, e.g., when the chirp signal is being generated during operation of the FMCW radar system.

SUMMARY

In accordance with an embodiment, a radio-frequency integrated circuit (RFIC) includes: a phase-locked loop (PLL) configured to generate a frequency modulated signal under control of a control signal; a frequency divider circuit configured to divide a frequency of the frequency modulated signal to generate a first frequency signal, wherein a frequency of the first frequency signal is proportional to a frequency of the frequency modulated signal; and a frequency linearity measurement circuit configured to measure a frequency linearity of the frequency modulated signal while the frequency modulated signal is being generated by the PLL, the frequency linearity measurement circuit comprising: a first measurement circuit comprising a counter, wherein the counter is controlled by a gate signal having a gate signal period, wherein the first measurement circuit is configured to generate a first estimate of an integer number of clock cycles of the first frequency signal within a respective gate signal period of the gate signal; a second measurement circuit comprising a time-to-digital converter (TDC), wherein the TDC is controlled by the gate signal, and is configured to generate a second estimate of a fractional number of clock cycle of the first frequency signal within the respective gate signal period of the gate signal; a reference measurement circuit configured to generate a third estimate of an expected number of clock cycles within the respective gate signal period of the gate signal; and a closed-loop frequency tracking circuit configured to track a frequency error between an expected frequency and a measured frequency, wherein the expected frequency is determined based on the third estimate, and the measured frequency is determined based on a sum of the first estimate and the second estimate.

In accordance with an embodiment, a circuit for measuring a frequency linearity includes a first measurement circuit comprising: a counter, wherein a first input terminal of the counter is configured to receive a first frequency signal, wherein a second input terminal of the counter is configured to receive a gate signal having a gate signal period, wherein the counter is configured to count clock cycles of the first frequency signal and is configured to output a value of the counter at first edges of the gate signal; a first delay element coupled to an output of the counter and configured to store the output of the counter at a previous first edge of the gate signal; and a modulo circuit coupled to the output of the counter and an output of the first delay element, wherein the modulo circuit is configured to compute the number of clock cycles of the first frequency signal in a respective gate signal period. The circuit further includes a second measurement circuit comprising: a time-to-digital converter (TDC), wherein the TDC is configured to measure a time offset between the first edge of the gate signal and a corresponding first edge of the first frequency signal; a second delay element coupled to an output of the TDC and configured to store $N_{GATE}$ previous outputs of the TDC; a divider configured to divide a difference between an output signal of the TDC and an output signal of the second delay element by $N_{GATE}$; and a scaling circuit coupled to an output of the divider and configured to scale an output signal of the divider by a scaling factor. The circuit further includes: a first adder circuit configured to compute a sum of an output signal of the first measurement circuit and an output signal of the second measurement circuit; and a reference measurement circuit configured to calculate a reference signal indicating an expected number of clock cycles in the gate signal period.

In accordance with an embodiment, a method of operating a radio-frequency integrated circuit (RFIC) includes: generating a frequency modulated signal using a phase-locked loop (PLL) of the RFIC; and measuring a frequency linearity of the frequency modulated signal while the frequency modulated signal is being generated by the PLL, comprising: frequency dividing the frequency modulated signal to generate a first frequency signal; generating, using a first measurement circuit that comprises a counter controlled by a gate signal having a gate signal period, a first estimate of an integer number of clock cycles of the first frequency signal within a respective gate signal period of the gate signal; generating, using a second measurement circuit comprising a time-to-digital converter (TDC) controlled by the gate signal, a second estimate of a fractional number of clock cycle of the first frequency signal within the respective gate signal period of the gate signal; adding, using a first adder circuit, the first estimate and the second estimate to generate a measured number of clock cycles within the respective gate signal period of the gate signal; generating, using a reference measurement circuit, a third estimate of an expected number of clock cycles within the respective gate signal period of the gate signal; and generating an estimate of a difference between the measured number of clock cycles and the expected number of clock cycles using a closed-loop frequency tracking circuit, wherein the closed-loop frequency tracking circuit is coupled to an output of the reference measurement circuit and an output of the first adder circuit.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EXAMPLES

Figure 1:
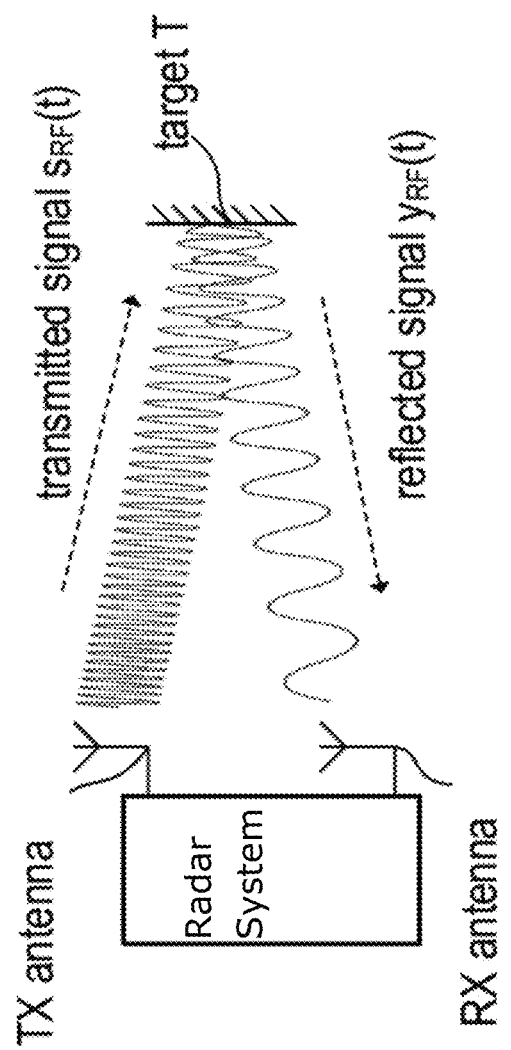
FIG. 1 illustrates a radar system, in an embodiment.

The making and using of the presently disclosed examples are discussed in detail below. It should be appreciated, however, that the present invention provides many applicable inventive concepts that can be embodied in a wide variety of specific contexts. The specific examples discussed are merely illustrative of specific ways to make and use the invention, and do not limit the scope of the invention. Throughout the discussion herein, unless otherwise specified, the same or similar reference numerals in different figures refer to the same or similar component.

The present disclosure will be described with respect to examples in a specific context, namely real-time frequency linearity measurement for chirp signals in an FMCW radar system. One skilled in the art will readily appreciate that the principles disclosed herein may be applied to measure frequency linearity for other signals and/or other systems.

FIG. 1 illustrates the working principle of a frequency-modulated continuous-wave (FMCW) radar system, in an example. In the illustrated example of FIG. 1, the FMCW radar system transmits a radio frequency (RF) signal, which is a frequency-modulated continuous-wave signal, using one or more transmit (Tx) antennas. The transmitted RF signal bounces back from a target, and is received by the FMCW radar system using one or more receive (Rx) antennas. In FMCW radar systems, the frequency difference between the received RF signal and the transmitted RF signal increases proportionally with the time delay between the transmitted and received RF signals. Therefore, the distance between the FMCW radar and the target can be determined by finding the frequency difference between the transmitted and received RF signals.

Figure 2:
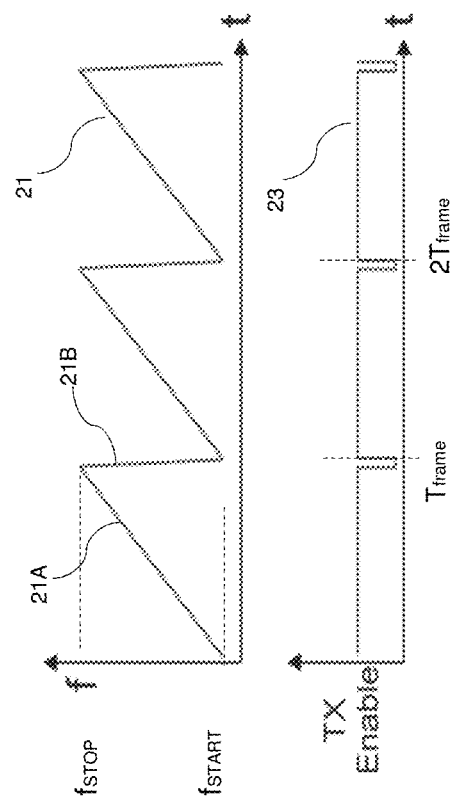
FIG. 2 illustrates an RF signal of a frequency-modulated continuous-wave (FMCW) radar system, in an embodiment.

FIG. 2 illustrates an RF signal 21 of an FMCW radar system, in an embodiment. In FIG. 2, two subplots are illustrated. The top subplot shows the frequency of the RF signal 21 (e.g., an FWCW signal) over a plurality of frames, where each frame has a duration of $T_{frame}$. Each frame of the RF signal includes a frequency ramp signal 21A, with the frequency of the RF signal 21 changes (e.g., increases) linearly from a first frequency $f_{START}$ to a second frequency $f_{STOP}$, as illustrated in FIG. 2. The frequency ramp signal 21A within each frame is also referred to as a chirp signal. Within each frame, a fly-back signal 21B is generated after the frequency ramp signal 21A in a short period of time (referred to as a fly-back period), during which the frequency of the RF signal 21 drops quickly from $f_{STOP}$ back to $f_{START}$. In FMCW radar systems, transmission of the RF signal 21 may be disabled during the fly-back periods. The lower subplot of FIG. 2 shows a Tx enable signal 23 for enabling (e.g., allowing) or disabling (e.g., stopping) transmission of the RF signal 21. In the example of FIG. 2, the Tx enable signal 23 is de-asserted (e.g., having a logic low value) during the fly-back periods, which instructs the RF transmitter of the FMCW radar system to stop transmission of the RF signal 21 during the fly-back periods.

Figure 3:
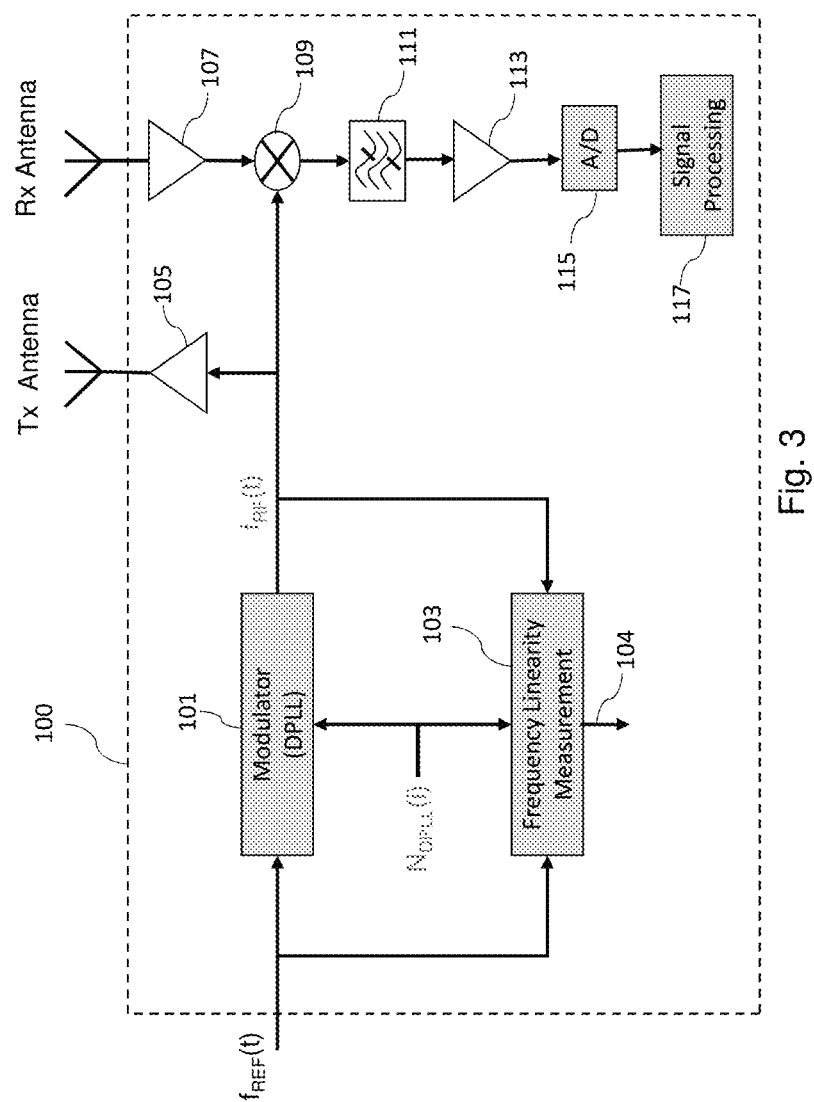
FIG. 3 illustrates a block diagram of a radio-frequency integrated circuit (RFIC) with real-time frequency linearity measurement capability, in an embodiment.

FIG. 3 illustrates a block diagram of a radio-frequency integrated circuit (RFIC) 100 with real-time frequency linearity measurement capability, in an embodiment. The RFIC 100 may be used in an FMCW radar system. Note that for simplicity, not all features of the RFIC 100 are illustrated in FIG. 3. For ease of discussion, the linearity of frequency is referred to as "frequency linearity" throughout the discussion herein.

Referring to FIG. 3, the RFIC 100 includes a digital phase-locked loop (DPLL) 101, a frequency linearity measurement circuit 103 (also referred to as a chirp linearity measurement circuit), amplifiers 105/107/113, a mixer 109, a filter 111, an analog-to-digital converter (ADC) 115, and a signal processing block 117. The DPLL 101 is configured to accept a reference frequency signal $f_{REF}(t)$ and generate an RF signal $f_{RF}(t)$ under the control of a control signal $N_{DPLL}(i)$ In some embodiments, the reference frequency signal $f_{REF}(t)$ is an external frequency signal (e.g., a sinusoidal signal, a clock signal, or the like) having a known frequency (e.g., a fixed frequency), and is generated by, e.g., a crystal oscillator. The RF signal $f_{RF}(t)$ may be the RF signal 21 of FIG. 2 and includes a chirp signal in each frame. The control signal $N_{DPLL}(i)$ is a digital control signal, which may sweep across a range of values (e.g., increase linearly across a range of discrete values) to control the DPLL 101 to generate the chirp signal in each frame of the RF signal $f_{RF}(t)$. Digital phase-locked loops are known and used in the art, thus details are not discussed here. Note that digital phase-locked loop is used in the illustrated embodiments as a non-limiting example. The principle of the disclosure applies to variations of the disclosed embodiments, e.g., when the digital phase-locked loop is replaced by an analog phase-locked loop controlled by a respective control signal.

In the transmit path of the RFIC 100, the RF signal $f_{RF}(t)$ is amplified by an amplifier 105 (e.g., an RF amplifier) and is transmitted by a transmit (Tx) antenna. As discussed above with reference to FIG. 2, the chirp signal in each frame of the RF signal $f_{RF}(t)$ is transmitted while no RF signal is transmitted during the fly-back periods. In some embodiments, the frequency linearity measurement disclosed herein is performed only when the chirp signal is being generated. Therefore, within the context of discussion of the frequency linearity measurement, the RF signal $f_{RF}(t)$ may be conceptionally considered as including only the chirp signals (e.g., with a fly-back period of zero), and therefore, the RF signal $f_{RF}(t)$ may also be referred to as a chirp signal $f_{RF}(t)$.

In the receive path of the RFIC 100, the reflected RF signal is received by a receive (Rx) antenna. The output of the Rx antenna is amplified by an amplifier 107, and the output of the amplifier 107 is sent to a first input terminal of a mixer 109. The RF signal $f_{RF}(t)$ is sent to a second input terminal of the mixer 109. The mixer 109 mixes the output of the amplifier 107 with the RF signal $f_{RF}(t)$ to down-convert the received RF signal. The output of the mixer 109 is filtered by the filter in (e.g., an analog band-pass filter), then amplified by the amplifier 113. The output of the amplifier 113 is converted into digital data by the ADC 115, and the output of the ADC 115 is sent to the signal processing block 117 for target detection. The signal processing block 117 may be or include a micro-controller.

As illustrated in FIG. 3, the chirp signal $f_{RF}(t)$ and the control signal $N_{DPLL}(i)$ are sent to the frequency linearity measurement circuit 103. The frequency linearity measurement circuit 103 generates digital outputs indicative of (e.g., proportional to) the frequency linearity of the chirp signal, while the chirp signal is being generated. The capability to generate real-time measurements of frequency linearity may greatly improve the performance of the FMCW radar system, since the chirp signal $f_{RF}(t)$ is used in both transmission and reception (e.g., used by the mixer 109) of the radar signal. For example, when non-linearity in the frequency of the chirp signal $f_{RF}(t)$ is detected, the RFIC 100 may adjust accordingly to reduce the performance degradation caused by the frequency non-linearity, e.g., by reducing the slope of the chirp signal to reduce frequency non-linearity, or by using enhanced processing algorithm in the signal processing block 117 to compensate for the frequency non-linearity. The enhanced processing algorithm may be more computationally intensive and may cause increased power consumption of the RFIC 100. Therefore, by enabling the enhanced processing algorithm only when necessary (e.g., when high frequency non-linearity is detected), the power consumption of the RFIC 100 is reduced. Details of the frequency linearity measurement circuit 103 are discussed hereinafter.

Figure 4:
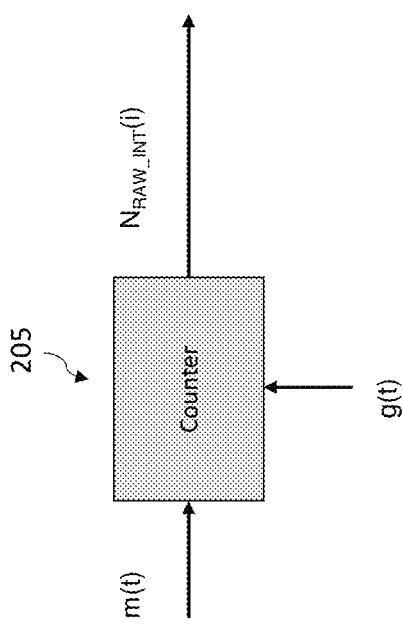
FIG. 4 illustrates a counter used in frequency linearity measurement, in an embodiment.
Figure 5:
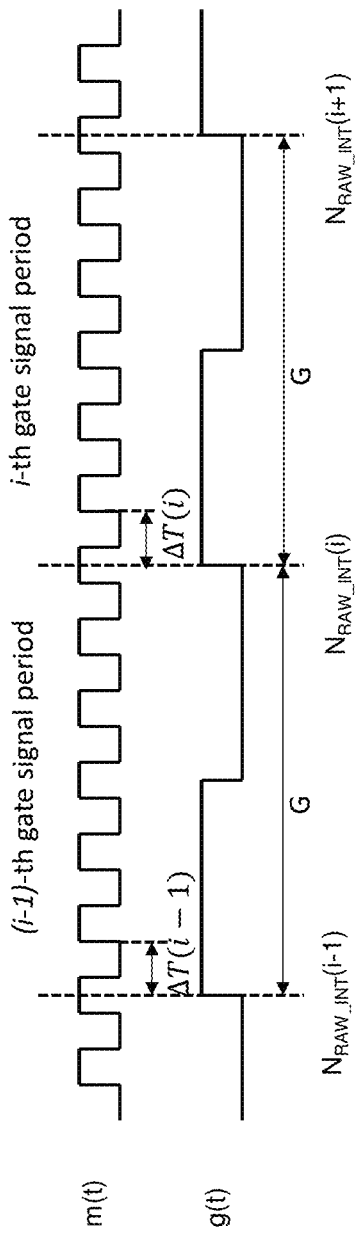
FIG. 5 is a timing diagram illustrating operation of the counter of FIG. 4, in an embodiment.

FIG. 4 illustrates a counter 205 used in the frequency linearity measurement circuit 103, in an embodiment. FIG. 5 is a timing diagram illustrating operation of the counter 205 of FIG. 4, in an embodiment. As illustrated in FIGS. 4 and 5, the counter 205 is configured to receive a measurement signal m(t) (e.g., a frequency signal whose frequency is to be measured) at a first input terminal, and is configured to receive a gate signal g(t) at a second input terminal. The gate signal g(t) is a control signal with a gate signal period G. As an example, the gate signal g(t) may be the reference frequency signal $f_{REF}(t)$. FIG. 5 illustrates an example of the measurement signal m(t) and an example of the gate signal g(t).

In the example of FIGS. 4 and 5, the counter 205 counts the number of clock cycles in the measurement signal m(t). For example, the value of the counter 205 (also referred to as the counter value) is incremented by 1 for each rising edge of the measurement signal m(t). At the rising edge of the i-th gate signal period of the gate signal g(t), the value of the counter 205 is latched at the output of the counter 205 as a counter output $N_{RAW\_INT}(i)$. In other words, the counter is configured to output the counter value at the rising edges of the gate signal g(t). Stated yet another way, the output of the counter 205 is updated once every gate signal period G at the rising edge of each gate signal g(t). Note that in each frame of the chirp signal, when the frequency of the chirp signal $f_{RF}(t)$ increases from $f_{START}$ to $f_{STOP}$ (see FIG. 2), the counter 205 counts the clock cycles of the measurement signal m(t) continuously (e.g., without being reset or stopped). In the discussion herein, it is assumed that each frame of the chirp signal $f_{RF}(t)$ contains multiple (e.g., tens of, hundreds of, or more) gate signal period G.

In the illustrated embodiment, the counter 205 has a maximum counter value $N_{MAX}-1$ (e.g., counts a total of $N_{MAX}$ different values from zero to $N_{MAX}-1$). After the counter value reaches the maximum counter value $N_{MAX}-1$, the counter value wraps around to zero (e.g. goes back to zero) at the next increment of the counter value (e.g., at the next rising edge of the measurement signal m(t)). As a non-limiting example, a 10-bit binary counter has a maximum counter value $N_{MAX}-1$ of 1023, and after the counter counts from zero to 1023, the counter value becomes zero at the next rising edge of the measurement signal m(t), and the counter starts counting up from zero again. In some embodiments, the counter size (e.g., the max counter value $N_{MAX}-1$) is designed to be large than the number of clock cycles of the measurement signal m(t) within one gate signal period G, which means that the "wrapping-around" (e.g., counter value goes back to zero) of the counter value can occur at most once in any given gate signal period G. By choosing the counter size as discussed above, the number of clock cycles (e.g., the number of rising edges, which is an integer number) of the measurement signal m(t) within the (i-1)-th gate signal period of the gate signal g(t) can be calculated by the following modulo operation: $\mod(N_{RAW\_INT}(i) - N_{RAW\_INT}(i-1), N_{MAX})$, where $N_{RAW\_INT}(i)$ and $N_{RAW\_INT}(i-1)$ are the outputs of the counter 205 at the rising edges of the i-th and (i-1)-th gate signal periods, respectively. The modulo operation ensures that the correct number of clock cycles is counted for any gate signal period, even when a "wrapping-around" of the counter value occurs during that gate signal period.

Figure 6:
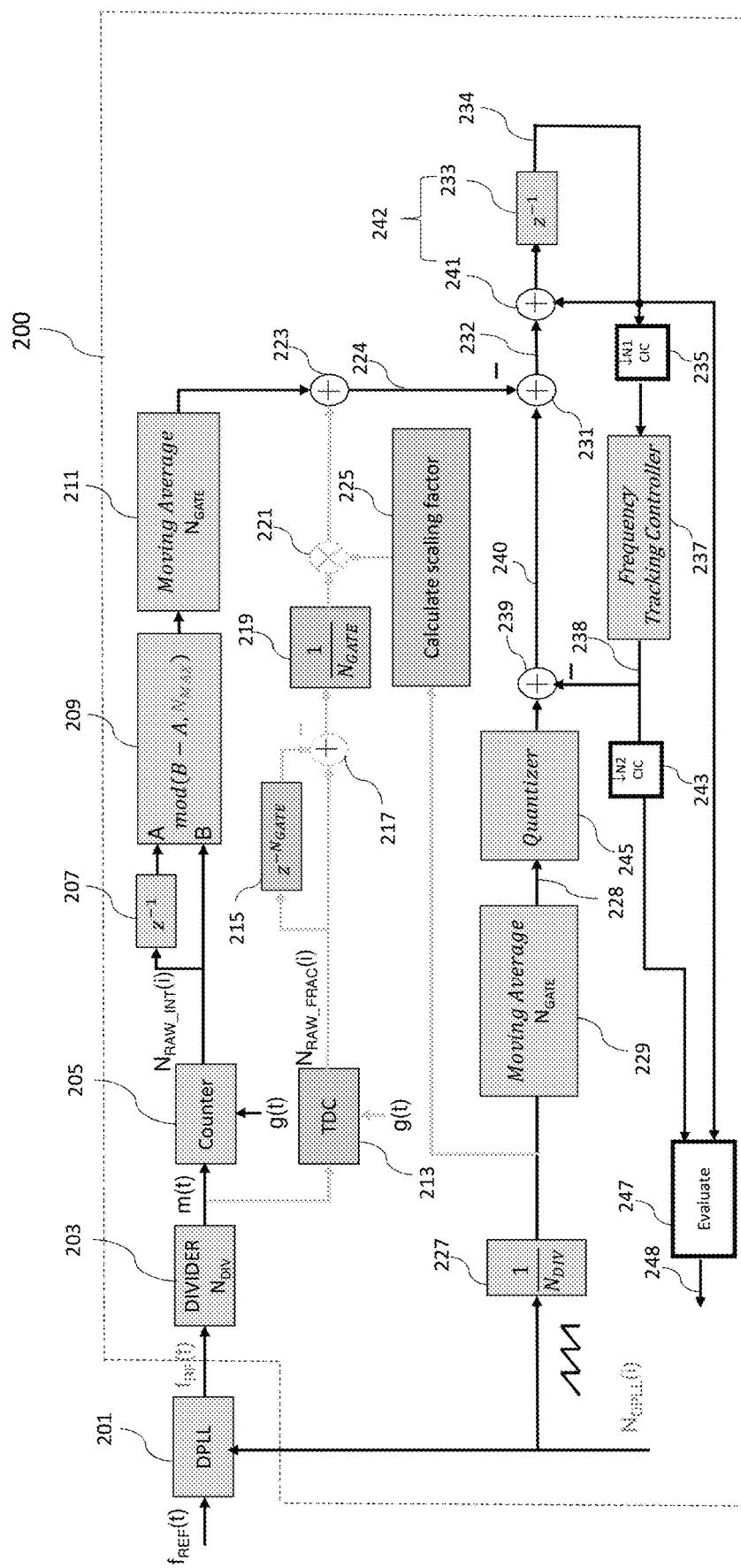
FIG. 6 illustrates a block diagram of a frequency linearity measurement circuit, in an embodiment.

FIG. 6 illustrates a block diagram of a frequency linearity measurement circuit 200, in an embodiment. The frequency linearity measurement circuit 200 may be used as the frequency linearity measurement circuit 103 in FIG. 3. FIG. 6 further illustrates a DPLL 201, which corresponds to the DPLL 101 in FIG. 3. Although the DPLL 201 is illustrated as outside the dashed line enclosed region for the frequency linearity measurement circuit 200, the DPLL 201 may be considered as part of the frequency linearity measurement circuit 200.

Referring to FIG. 6, the DPLL 201 receives the reference frequency signal $f_{REF}(t)$ (e.g., a frequency signal having a fixed, known frequency $F_{REF}$). To generate the chirp signal $f_{RF}(t)$, the digital control signal $N_{DPLL}(i)$ increases linearly from a first value (corresponding to $f_{START}$) to a second value (corresponding to $f_{STOP}$) in each frame of the chirp signal. In some embodiments, the frequency $F_{RF}$ of the chirp signal $f_{RF}(t)$ generated by the DPLL 201 is determined by: $F_{RF}=F_{REF}*N_{DPLL}(i)$.

The chirp signal $f_{RF}(t)$ at the output of the DPLL 201 is divided by a frequency divider circuit 203 to generate the measurement signal m(t). The frequency divider circuit 203 reduces the frequency of its input signal by a factor of $N_{DIV}$, and therefore, the frequency of the measurement signal m(t), denoted as $F_m$, is $1/N_{DIV}$ of the frequency of the chirp signal $f_{RF}(t)$. In other words, the measurement signal m(t) is also a chirp signal having the same frame length as the chirp signal $f_{RF}(t)$, but has lower frequencies than the chirp signal $f_{RF}(t)$. Note that similar to the chirp signal $f_{RF}(t)$, the frequency $F_m$ of the measurement signal m(t) varies (e.g., increases) within one frame of the chirp signal. Frequency divider circuits are known and used in the art, thus details are not discussed here.

The frequency linearity of the measurement signal m(t) is measured by two measurement circuits: a first measurement circuit for measuring the integer number of clock cycles of the measurement signal m(t) within each gate signal period, and a second measurement circuit for measuring the fractional number of clock cycle of the measurement signal m(t) within each gate signal period. Details are discussed below.

As illustrated in FIG. 6, the first measurement circuit includes the counter 205, a delay element 207, a modulo circuit 209, and a moving average circuit 211. The counter 205 may be reset at the beginning of each frame of the measurement signal m(t), and counts the number of clock cycles (e.g., counting each rising edge) of the measurement signal m(t) in the frame. The counter 205 is controlled by the gate signal g(t). At each rising edge of the gate signal g(t), the counter value is latched at the output of the counter 205, details are discussed above with reference to FIG. 2.

Note that the counter 205 is not reset after each gate signal period of the gate signal g(t) ends, thus after being reset (e.g., at the beginning of each frame of the measurement signal m(t)), the counter value keeps going up for each rising edge of the clock cycle of the measurement signal m(t). Therefore, as described above with reference to FIG. 2, to determine the number of clock cycles counted in the (i−1)-th gate signal period, the following modulo operation is performed: $mod(N_{RAW\_INT}(i)-N_{RAW\_INT}(i-1), N_{MAX})$, where $N_{RAW\_INT}(i)$ and $N_{RAW\_INT}(i-1)$ are the outputs of the counter 205 at the rising edges of the i-th and (i−1)-th gate signal periods, respectively, and $N_{MAX}-1$ is the maximum value of the counter 205.

The delay element 207 in FIG. 6 is a memory element (e.g., a register, a D flip-flop, or the like) that stores the output of the counter 205 at the previous rising edge of the gate signal g(t). The modulo circuit 209 implements the modulo operation discussed above to compute the integer number of clock cycles of the measurement signal m(t) counted in each gate signal period. Note that the modulo circuit 209 generates one output for each gate signal period.

The output of the modulo circuit 209 is sent to the moving average circuit 211, which calculates a moving average of the latest $N_{GATE}$ number of outputs from the modulo circuit 209. For example, the moving average circuit 211 may comprise a shifter register having $N_{GATE}$ memory elements. As the latest output from the modulo circuit 209 is shifted into the shifter register, the average of the $N_{GATE}$ values stored in the shift register (e.g., the latest $N_{GATE}$ outputs from the modulo circuit 209) is calculated as the output of the moving average circuit 211. In an embodiment, the average is calculated by summing up the latest $N_{GATE}$ outputs from the modulo circuit 209, and dividing the sum by $N_{GATE}$. The averaging operation performed by the moving average circuit 211 helps to reduce the random error contained in the calculated data.

Still referring to FIG. 6, the second measurement circuit of the frequency linearity measurement circuit 200 includes a time-to-digital converter (TDC) 213, a delay element 215, a subtractor 217, a divider 219, a scaling circuit 221, and a scaling factor generator 225. In some embodiments, the TDC is configured to, for each gate signal period, provide a measurement of a time offset ΔT between the rising edge of the gate signal g(t) and a nearest rising edge of the measurement signal m(t) within that gate signal period. In the illustrated embodiment, for the i-th gate signal period, the rising edge of the gate signal g(t) marks the beginning of the i-th gate signal period, and therefore, the corresponding nearest rising edge of the measurement signal m(t) is the first rising edge of the measurement signal m(t) at or after the rising edge of the gate signal g(t). FIG. 5 illustrates the time offset ΔT(i−1) and ΔT(i) for the (i−1)-th and i-th gate signal period.

Time-to-digital converter is known and used in the art. Different implementations are possible. As a non-limiting example, the TDC 213 may be implemented as a shift register driven by a clock signal, which clock signal has a known, fixed high frequency $F_{TDC}$ independent of the frequency of the measurement signal m(t). The frequency $F_{TDC}$ of the clock signal may be orders of magnitude higher than the frequency of the measurement signal m(t). To measure the time offset ΔT, for each gate signal period, the shift register, after being initialized to an all-zero state, is enabled at the rising edge of the gate signal g(t) and a digital bit of 1 is shifted into the first register in the shifter register. The digital bit 1 is shifted to the next register in the shift register for each clock cycle (e.g., at the rising edge) of the clock signal having frequency $F_{TDC}$. When the first rising edge of the measurement signal m(t) within the gate signal period arrives, the number of registers the digital bit 1 has propagated through so far indicates (e.g., is proportional to) the time offset between the rising edge of the gate signal g(t) and the nearest rising edge of the measurement signal m(t) within that gate signal period.

Still referring to FIG. 6, the output of the TDC 213 is sent to the delay element 215. In some embodiment, the delay element 215 is a delay-line, a shift-register, or the like, and has $N_{GATE}$ number of memory elements (e.g., registers) for storing the previous $N_{GATE}$ number of outputs from the TDC 213. The output of the delay element 215 is the oldest stored output of the TDC 213, which was generated $N_{GATE}$ gate signal periods before.

The output of the delay element 215 and the output of the TDC 213 are sent to the subtractor 217, which computes an output by subtracting the output of the delay element 215 from the output of the TDC 213. Denote the output of the TDC at the i-th gate signal period of the gate signal g(t) as $N_{RAW\_FRAC}(i)$, the output of the subtractor 217 for the i-th gate signal period is $N_{RAW\_FRAC}(i)-N_{RAW\_FRAC}(i-N_{GATE})$ The output of the subtractor 217 is divided by $N_{GATE}$ by the divider 219. Or equivalently, the divider 219 may be considered as a multiplier that scales the output of the subtractor 217 by a factor of $1/N_{GATE}$. The output of the divider 219 is used as an estimate of the time offset ΔT between the rising edge of the gate signal g(t) and a nearest rising edge of the measurement signal m(t) within that gate signal period. The estimate of the time offset ΔT provided by the divider 219 is scaled by the scaling circuit 221 (e.g., a multiplier) by a scaling factor provided by the scaling factor generator 225, and the output of the scaling circuit 221 is the fractional number of clock cycle of the measurement signal m(t) counted within the present gate signal period. More details are discussed hereinafter.

Figure 7:
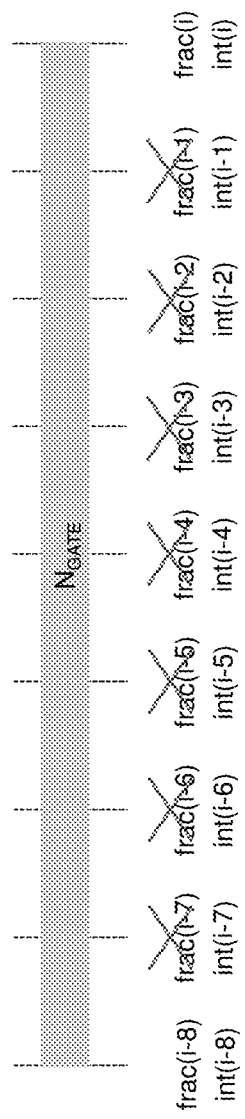
FIG. 7 illustrates the operation of certain functional blocks of the frequency linearity measurement circuit of FIG. 6, in an embodiment.

FIG. 7 illustrates details of the operation of certain functional blocks of the frequency linearity measurement circuit 200 of FIG. 6, in an embodiment. Referring temporarily to FIG. 7, in the example of FIG. 7, the number $N_{GATE}$ has a value of 8. Therefore, FIG. 7 illustrates nine vertical lines indicating nine rising edges of the i-th, (i−1)-th, ... (i−8)-th gate signal periods of the gate signal g(t) that delimit eight gate signal periods, and the values int(i), int (i−1), ... , int(i−8) are the outputs of the counter 205 at the nine rising edges of the gate signal g(t). By performing the modulo operation discussed above, the nine counter outputs are used to calculate the number of integer clock cycles of the measurement signal m(t) counted within each of the eight gate signal periods. These eight integer clock cycle counts are averaged (by the moving average circuit 211 in FIG. 6) to generate an estimate of the integer number of clock cycles of the measurement signal m(t) for the i-th gate signal period.

As illustrated in FIG. 7, the estimate of for the time offset ΔT between the rising edge of the i-th gate signal period of the gate signal g(t) and the nearest rising edge of the measurement signal m(t) in the i-th gate signal period is calculated using two outputs from the TDC 213 that are separated (in time) by $N_{GATE}$ number of gate signal periods. The difference between these two outputs from the TDC 213 is divided by $N_{GATE}$, and used as the estimate for the time offset ΔT. Therefore, the estimate for the time offset ΔT may be considered as an average of the time offsets of the previous $N_{GATE}$ gate signal periods. The averaging operation may advantageously reduce the random error in the calculated data.

Referring back to FIG. 6, the output of the divider 219 is scaled by a scaling factor to generate the fractional number of clock cycle of the measurement signal m(t) counted in each gate signal period. Recall that in the illustrated embodiment, the TDC output is a number indicating the number of clock cycles of the TDC clock signal having frequency $F_{TDC}$. Therefore, if the output of the divider 219 is M, then the time offset (e.g., measured in unit of second) is $M/F_{TDC}$, and the corresponding fractional number of clock cycles of the measurement signal M(t) is $$M * \frac{F_m}{F_{TDC}},$$

where $F_m$ is the frequency of the measurement signal m(t). Note that frequency $F_m$ varies (e.g., increases) during each frame of the chirp signal. Therefore, the scaling factor used in calculating the fractional number of clock cycles of the measurement signal m(t) needs to be adjusted in accordance with the value of $F_m$, details of which are discussed below.

In some embodiments, the scaling factor generator 225 calculates the scaling factor $$S = \frac{F_m}{F_{TDC}},$$

and the scaling circuit 221 scales the output of the divider 219 by the scaling factor S. To facilitate efficient hardware implementation, an example calibration-based method is described here for the scaling factor generator 225. The calibration-based method starts by finding, at a known fixed calibration frequency $F_{CAL}=N_0*F_{REF}$ for the measurement signal m(t), a base-line scaling factor $K_{TDC}=F_{CAL}/F_{TDC}$, where $F_{REF}$ is the frequency of the reference frequency signal $f_{REF}(t)$, and the calibration frequency $F_{CAL}$ may be a suitable frequency, e.g., a center frequency of the range of the frequencies for the chirp signal. Note that the base-line scaling factor $K_{TDC}$ is the inverse of $F_{TDC}/F_{CAL}$, and $F_{TDC}/F_{CAL}$ may be found easily by counting the number of TDC clock cycles in one clock cycle of the calibration frequency $F_{CAL}$. Next, to find the scaling factor for an actual frequency $F_m=N_{ACTUAL}*F_{REF}$ different from the calibration frequency $F_{CAL}$, rewrite the scaling factor as:

$$S = \frac{F_m}{F_{TDC}} = \tag{1}$$

$$\frac{F_m}{F_{CAL}} * \frac{F_{CAL}}{F_{TDC}} = \frac{N_{ACTUAL}}{N_0} * K_{TDC} = \frac{N_0 + (N_{ACTUAL} - N_0)}{N_0} * K_{TDC} =$$

$$[1 + \frac{1}{N_0}(N_{ACTUAL} - N_0)] * K_{TDC} = [1 + K_{FREQ}(N_{ACTUAL} - N_0)] * K_{TDC}$$

where $K_{FREQ}=1/N_0$. The values $K_{FREQ}$ and $K_{TDC}$ are constants given the calibration frequency $F_{CAL}$ and the TDC clock frequency $F_{TDC}$, and can be calculated once and saved for use later. Note that since the measurement signal m(t) is a frequency divided version (e.g., divided by a factor of $N_{DIV}$) of the chirp signal $f_{RF}(t)$, the values $N_0$ and $N_{ACTUAL}$ have corresponding values of $N_{DPLL}(i)$ that is $N_{DIV}$ times larger. The divider 227 in FIG. 6 illustrates this relation. In other words, the divider 227 divides the corresponding values of $N_{DPLL}(i)$ by $N_{DIV}$ to produce the values $N_0$ and $N_{ACTUAL}$. In the illustrated embodiment, the $N_{ACTUAL}$ used in equation (1) is the average value of $N_{ACTUAL}$ that is averaged over a gate signal period. The scaling factor generator 225 generates the scaling factor S using equation (1) above, in some embodiments.

Figure 8:
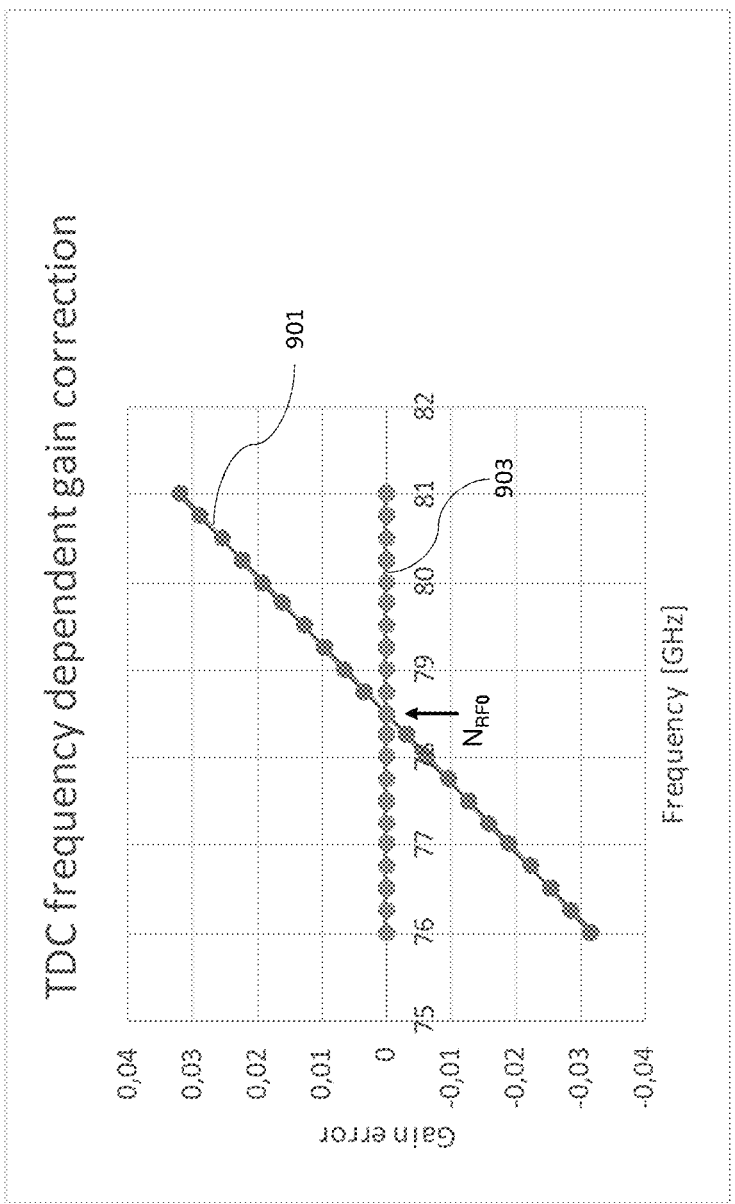
FIG. 8 illustrates adjustment of a scaling factor used in the frequency linearity measurement circuit of FIG. 6, in an embodiment.

FIG. 8 illustrates the adjustment of the scaling factor S using the above described calibration-based method. The curve 903 shows the error of the scaling factor S at different frequencies of the measurement signal m(t) using the calibration-based method discussed above. As illustrated in FIG. 8, there is no error in the scaling factor S across the frequency range. For comparison, the curve 901 shows the error in the scaling factor S if the based-line scaling factor $K_{TDC}$ is used for all frequencies of the measurement signal m(t). As shown in FIG. 8, the larger the difference between the calibration frequency (pointed to by the arrow with label $N_{RF0}$) and the actual frequency of the measurement signal m(t), the larger is the error in the scaling factor S.

Referring back to FIG. 6, the output of the moving average circuit 211 (which is an estimate of the integer number of clock cycles of the measurement signal m(t) in each gate signal period) and the output of the scaling circuit 221 (which is an estimate of the fractional number of clock cycle of the measurement signal m(t) in each gate signal period) are added by the adder 223. The output signal 224 of the adder 223 is the total number of clock cycles of the measurement signal m(t) in each gate signal period. Note that the adder 223 generates one output for each gate signal period.

In the disclosed embodiments, the integer number of clock cycles of the measurement signal m(t) in each gate signal period is determined by counting the number of rising edges of the measurement signal m(t), and the fractional number of clock cycle of the measurement signal m(t) in each gate signal period is determined by finding the time offset between the rising edge of the gate signal g(t) and the nearest rising edge of the measurement signal m(t). These are, of course, no-limiting examples. It is possible to use the falling edge of the measurement signal m(t) to form the estimates of the integer number of clock cycles and the fractional number of clock cycles of the measurement signal m(t) in each gate signal period by, e.g., counting the number of falling edges of the measurement signal m(t), and finding time offset between the falling edge of the gate signal g(t) and the nearest falling edge of the measurement signal m(t). These and other variations are fully intended to be included within the scope of the present disclosure.

The frequency linearity measurement circuit 200 further includes a reference circuit that includes the divider 227 and a moving average circuit 229. The divider 227 divides the control signal $N_{DPLL}(i)$ by a factor of $N_{DIV}$. The output of the divider 227 is sent to the moving average circuit 229, which calculates a moving average of the outputs of the divider 227 over $N_{GATE}$ gate signal periods.

Note that each output of the divider 227, which is the digital value of $N_{DPLL}(i)/N_{DIV}$, corresponds to a frequency $F_m=N_{DPLL}(i)*F_{REF}/N_{DIV}$ for the measurement frequency m(t). Therefore, the output signal 228 of the moving average circuit 229 is a value proportional to the average frequency of the measurement signal m(t) over the latest $N_{GATE}$ gate signal periods. Multiplying the output of the moving average circuit 229 with a scaling factor $F_{REF}*G$ gives the expected average number of clock cycles of the measurement signal m(t) in the latest $N_{GATE}$ gate signal periods. In the illustrated embodiment, the scaling factor $F_{REF}*G$ is incorporated into the design of the moving average circuit 229 (not shown individually), and therefore, the output signal 228 of the moving average circuit 229 in FIG. 6 is the expected average number of clock cycles of the measurement signal m(t) in the latest $N_{GATE}$ gate signal periods. The averaging operation of the moving average circuit 229 may advantageously reduce random errors in the calculated data.

As illustrated in FIG. 6, the output signal 228 of the moving average circuit 229 is used as a reference signal. The difference between the output signal 228 (e.g., expected number of clock cycles in a gate signal period) and the output signal 224 (e.g. measured number of clock cycles in a gate signal period) is a value indicative of the frequency linearity of the chirp signal $F_{RF}(t)$ (or the measurement signal m(t)). For example, if the chirp signal $F_{RF}(t)$ has perfect frequency linearity, then the values of the difference between the output signal 228 and the output signal 224 may ideally be constant. If the frequency of the chirp signal $F_{RF}(t)$ starts to deviate from the linear behavior, then the values of the difference will deviate from the constant value.

In the example of FIG. 6, to improve the accuracy of the frequency linearity measurement, instead of using the difference between the output signal 228 and the output signal 224 to directly compute the frequency linearity measurement, a closed-loop frequency tracking circuit is used to track the difference between the output signal 228 and the output signal 224. Details are discussed hereinafter.

As illustrated in FIG. 6, the closed-loop frequency tracking circuit includes a subtractor 239, a subtractor 231, an adder 241, a delay element 233 (e.g., a D flip-flop, a register, or the like), and a frequency tracking controller 237. Optionally, a cascaded integrator-comb (CIC) filter 235 having a decimation factor of $N_1$ may be coupled between the delay element 233 and the frequency tracking controller 237. The adder 241 and the delay element 233 as connected in FIG. 6 form an accumulator 242 (may also be referred to as an integrator), which accumulates or integrates the output signal 232 of the subtractor 231. The output signal 234 (may also be referred to as the output signal of the accumulator 242) of the delay element 233 is sent to the adder 241 and the frequency tracking controller 237 (e.g., through the CIC filter 235).

Figure 9:
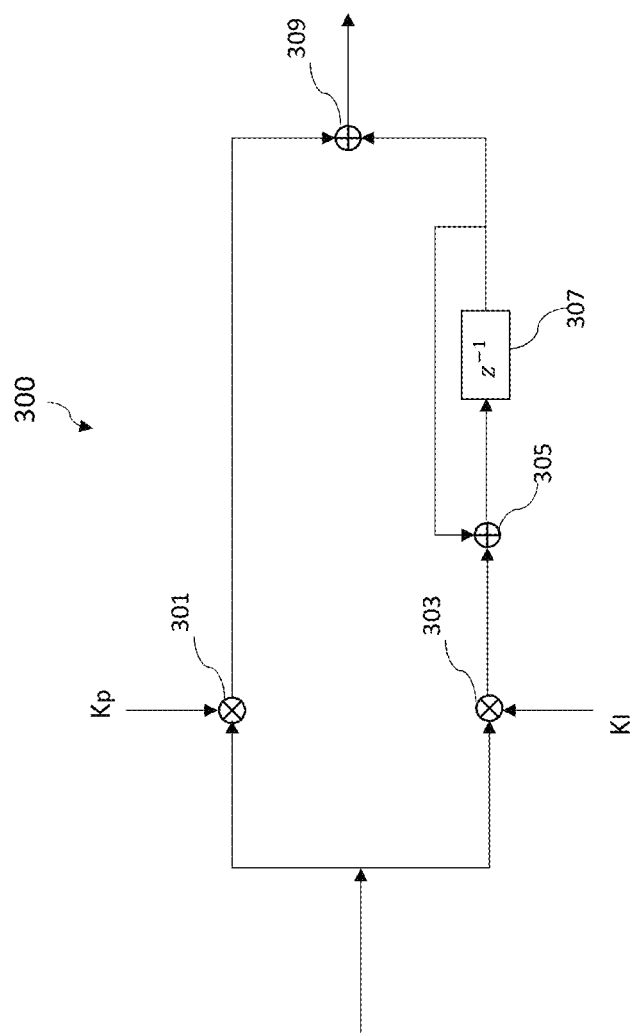
FIG. 9 illustrates a proportional-integral (PI) control circuit, in an embodiment.

The frequency tracking controller 237 is a proportional-integral (PI) control circuit, in an example embodiment. FIG. 9 illustrates a block diagram of a PI control circuit 300, in an embodiment. The PI control circuit 300 may be used as the frequency tracking controller 237 of FIG. 6. In the example of FIG. 9, the upper path of the PI control circuit 300 is the "proportional path" that includes a multiplier 301 with a scaling factor $K_p$, and the lower path of the PI control circuit 300 is the "integral path" that includes a multiplier 303 with a scaling factor $K_I$, and an integrator formed by an adder 305 and a delay element 307 (e.g., a D flip-flop, a register, or the like). The output signal of the proportional path and the output signal of the integral path are added together by an adder 309 to produce the output signal of the PI control circuit 300.

Referring back to FIG. 6, the accumulator 242 and the frequency tracking controller 237 may function as the feed-forward path and the feedback path of the closed-loop frequency tracking circuit, and the output signal 232 of the subtractor 231 may function as the frequency error that drives the closed-loop frequency tracking circuit. Therefore, the output signal 232 may also be referred to as a frequency error signal 232, and accordingly, the output signal 234 of the accumulator 242 may also be referred to as a phase error signal 234. In some embodiments, the closed-loop frequency tracking circuit functions as a closed-loop feedback control system to minimizes the frequency error signal 232 and to drive the phase error signal 234 toward zero during operation. The output signal 238 of the frequency tracking controller 237 tracks the frequency error signal 232. In other words, the output signal 238 of the frequency tracking controller 237 provides an estimate of the frequency error signal 232. The output signal 238 is then sent to an evaluation circuit 247 to compute the frequency linearity measurement and other performance metrics.

The CIC filter 235 has a highly efficient structure for hardware implementation, and provides filtering (e.g., low-pass filtering) function as well as sample rate conversion (e.g., down-sampling) function. CIC filter is known in the art, details are not discussed here. The lower sampling rate due to the use of the CIC filter 235 reduces processing load and processing power. In addition, the frequency response (e.g., bandwidth) of the CIC filter 235 may be easily tuned (e.g., by changings the programmable parameters of the CIC filter) to provide additional filtering in the feedback path to change the loop filter characteristics of the closed-loop frequency tracking circuit. For example, the additional low-pass filtering provided by the CIC filter 235 may allow the use of only the second measurement circuit (e.g., for measuring the fractional number of clock cycles) in the frequency linearity measurement circuit 200, and the first measurement circuit for measuring the integer number of clock cycles may be omitted. The resulting frequency error estimate (e.g., 238) due to the omitted first measurement circuit may be noisy, but the CIC filter 235 may be tuned easily (e.g., by changing its programmable parameters) to provide additional low-pass filtering to suppress the noises in the measurement. The CIC filter 235 is used as a non-limiting example in FIG. 6, other suitable filters or circuits may also be used and are fully intended to be included within the scope of the present disclosure. In some embodiments, the CIC filter 235 is omitted.

Figure 10:
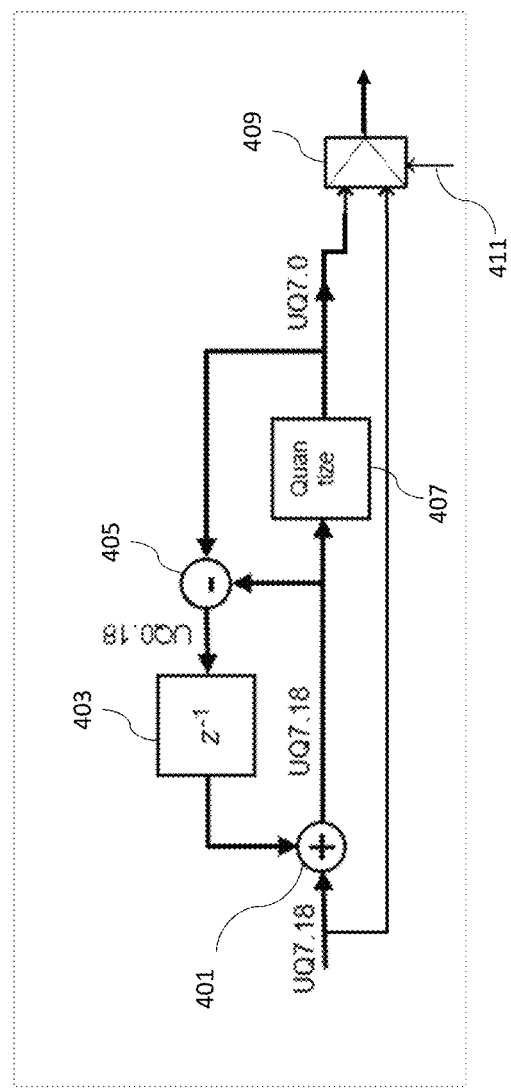
FIG. 10 illustrates a block diagram of a quantizer, in an embodiment.

Stilling referring to FIG. 6, the frequency linearity measurement circuit 200 includes a quantizer 245 between the moving average circuit 229 and the subtractor 239. In some embodiments, the quantizer 245 quantizers (e.g., re-formats, or changes the bit resolution of the digital data) the output signal 228 of the moving average circuit 229. The output signal of the quantizer 245 is sent to the subtractor 239. FIG. 10 illustrates a block diagram of the quantizer 245, in an embodiment.

Referring temporarily to FIG. 10, the quantizer 245 has an upper processing path that changes (e.g., re-formats) the input data format using a delta modulator structure. In the example of FIG. 10, the input data to the quantizer has a data format of UQ7.18, which stands for unsigned integer with 7 integer bits and 18 fractional bits. The input data is quantized (e.g., re-formatted) by a quantizing circuit 407 to produce an output data having a UQ7.0 data format. The difference between the input data (e.g., having a UQ7.18 data format) and the output data (e.g., having a UQ7.0 data format) of the quantizing circuit 407 is calculated by a subtractor 405, and the difference (e.g., having a UQ0.18 data format) is set to a delay element 403 (e.g., a D flip-flip). The output of the delay element 403 is added to the next input data by an adder 401, and the output of the adder 401 is sent to the quantizing circuit 407. The output of the quantizing circuit 407 is sent to a first input terminal of a multiplexer 409.

In addition, the quantizer 245 has a lower processing path, which is a direct-pass path that sends the input data (e.g., having a UQ7.18 data format) directly to a second input terminal of the multiplexer 409. Based on a selection signal applied at a control terminal 411 of the multiplexer 409, the original input data, or the quantized data from the quantizing circuit 407, is selected as the output of the multiplexer 409. In some embodiments, the number of quantizer output fractional bits used for the frequency linearity measurement circuit 200 depends on the measurement signal m(t) and the precision (e.g., number of bits, or bit resolution) of the measurement paths, such as the precision of the counter 205, the precision of the TDC 213, and the precision of the moving average circuits 211/229. The quantizer 245 provides two different data precisions that can be selected for different configurations to achieve improved performance. The selection signal applied at the control terminal 411 of the multiplexer 409 may be generated by, e.g., the evaluation circuit 247.

Referring back to FIG. 6, the output signal 238 of the frequency tracking controller 237 is sent to a CIC filter 243 having a decimation factor of $N_2$, and the output of the CIC filter 243 is sent to the evaluation circuit 247. In some embodiments, the CIC filter 243 is omitted, and the output signal 238 is sent directly to the evaluation circuit 247.

The evaluation circuit 247 may be, e.g., a micro-controller, or a circuit designed to compute the various performance metrics. In some embodiments, the evaluation circuit 247 computes a frequency linearity measurement using the output signal 238 (or a filtered version of the output signal 238 from the CIC filter 243). In some embodiments, the output signal 234 from the accumulator 242 is also sent to the evaluation circuit 247. The evaluation circuit 247 analyzes the performance of the frequency linearity measurement circuit 200 using the output signal 238 (e.g., estimate of the frequency error) and the output signal 234 (e.g., the phase error), and generate various performance metrics such as phase jitter histogram, phase jitter variance, and phase noise estimation, in addition to the frequency linearity measurement. In some embodiments, the evaluation circuit 247 compares the computed frequency linearity measurement with a threshold (e.g., a pre-determined threshold, a user-programmable threshold), and sets an error flag when the frequency linearity measurement rises above the threshold. In response to the error flag, RFIC 100 may take actions to reduce the non-linearity in the chirp signal, as discussed previously.

Figure 11A:
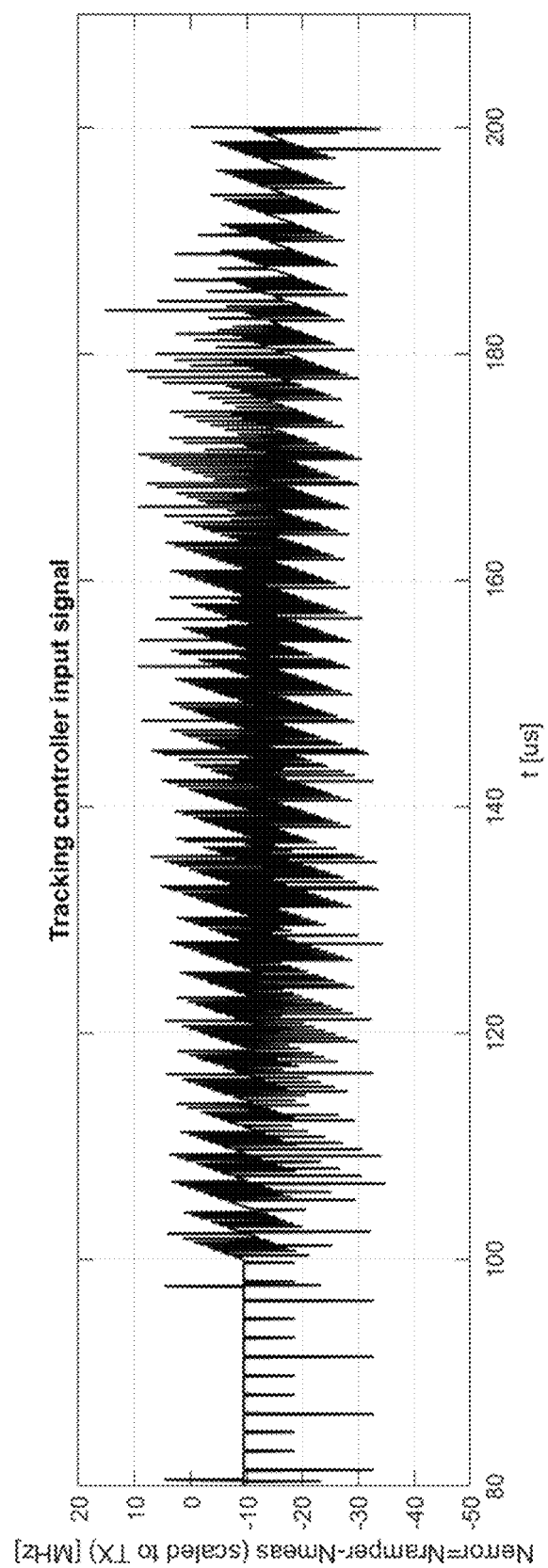
FIGS. 11A, 11B, 11C, and 11D illustrate the performance of the frequency linearity measurement circuit of FIG. 6, in an embodiment.
Figure 11B:
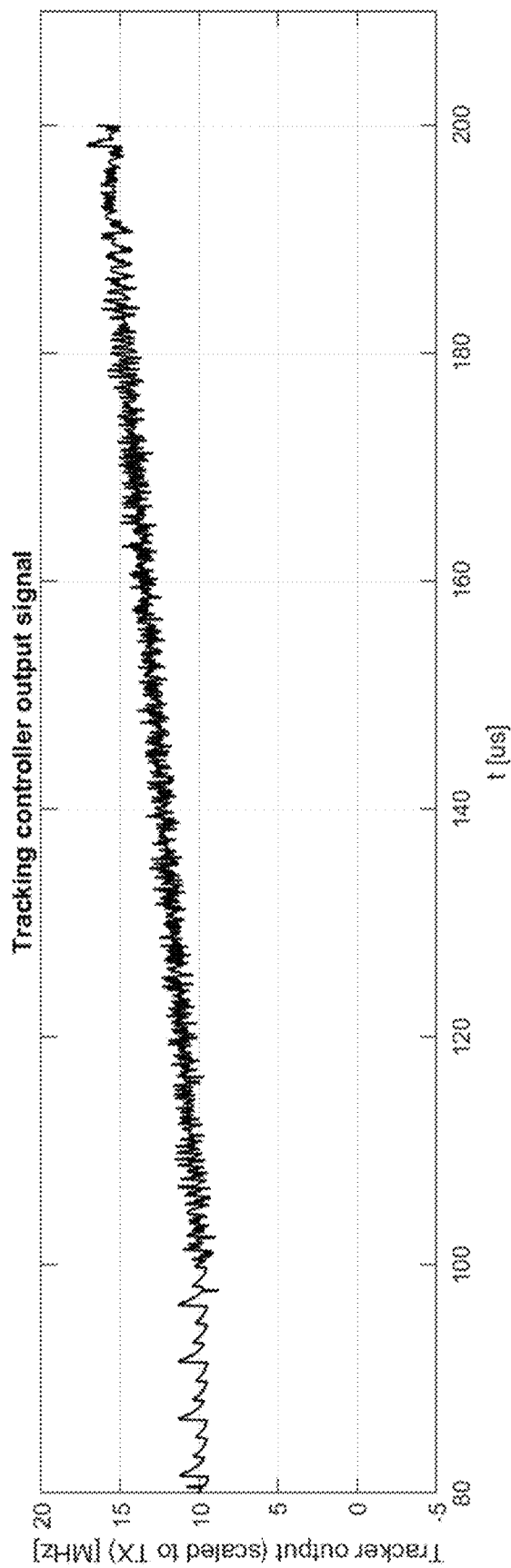
Figure 11C:
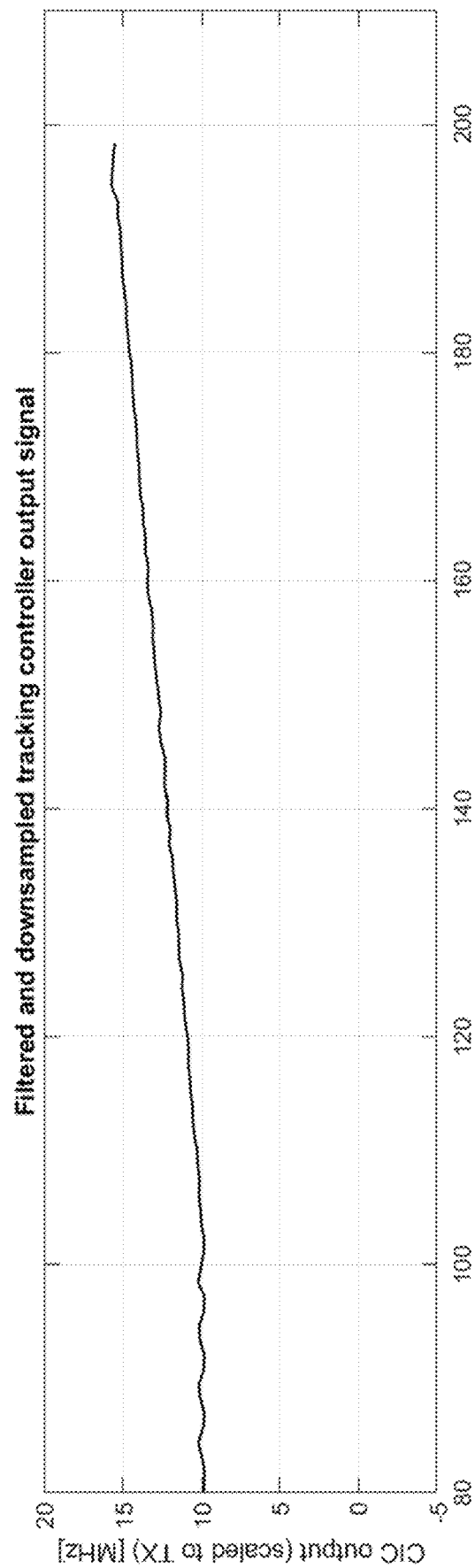
Figure 11D:
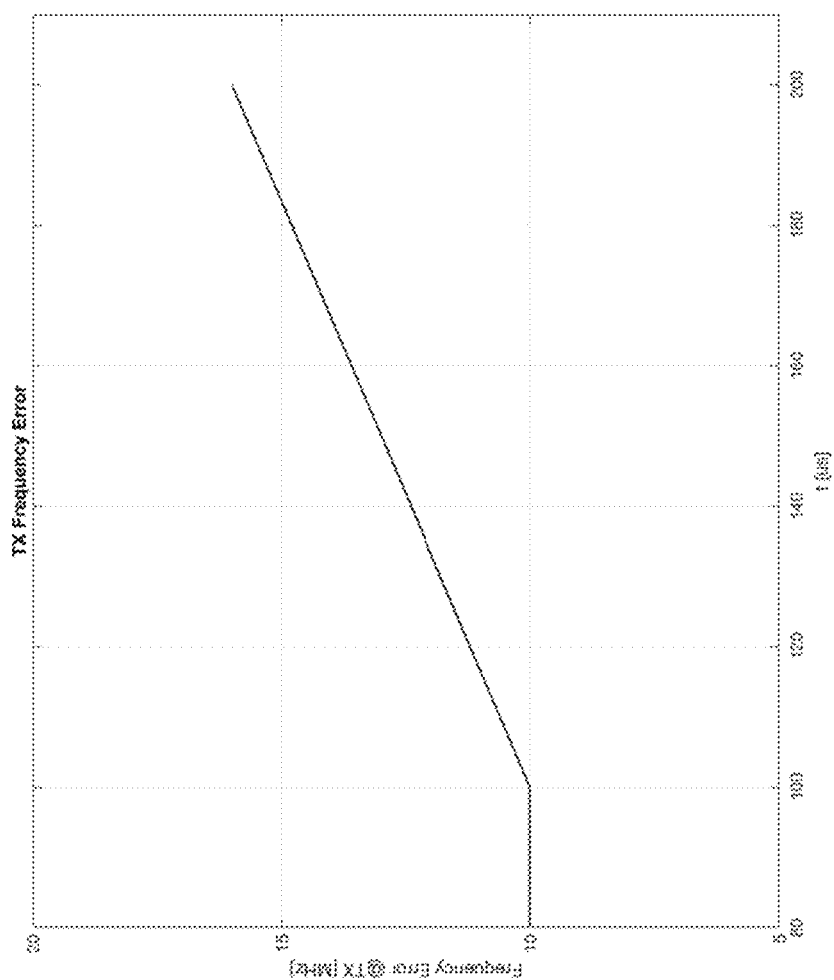

FIGS. 11A, 11B, 11C, and 11D illustrate the performance of the frequency linearity measurement circuit 200 of FIG. 6 simulated for a simulation setup, in an embodiment. FIG. 11A illustrates the output signal 232 in FIG. 6, where the x-axis is time, and the y-axis is normalized frequency error. FIG. 11B illustrates the output signal 238 of the frequency tracking controller 237. FIG. 11C illustrates the filtered and down-sampled version of the output signal 238. FIG. 11D illustrates the expected frequency error measurement. A comparison between FIGS. 11C and 11D show that the closed-loop frequency tracking circuit is able to track the frequency error and provide an accurate estimate of the frequency error.

Figure 12:
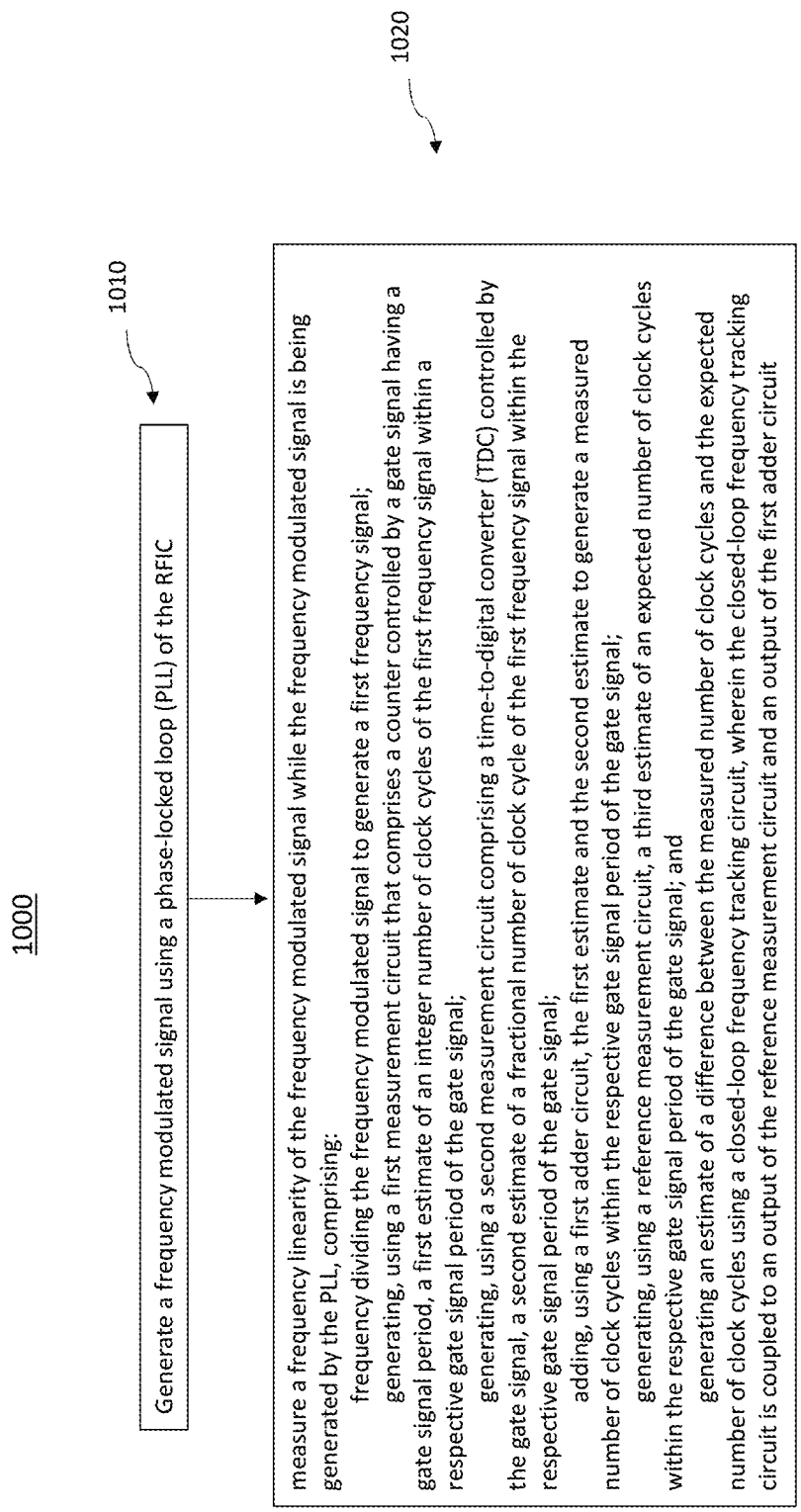
FIG. 12 illustrates a flow chart of a method of operating an RFIC, in some embodiments.

FIG. 12 illustrates a flow chart of a method woo of operating a radio-frequency integrated circuit (RFIC), in some embodiments. It should be understood that the example method shown in FIG. 12 is merely an example of many possible example methods. One of ordinary skill in the art would recognize many variations, alternatives, and modifications. For example, various steps as illustrated in FIG. 12 may be added, removed, replaced, rearranged, or repeated.

Referring to FIG. 12, at block 1010, a frequency modulated signal is generated using a phase-locked loop (PLL) of the RFIC. At block 1020, a frequency linearity of the frequency modulated signal is measured while the frequency modulated signal is being generated by the PLL, comprising: frequency dividing the frequency modulated signal to generate a first frequency signal; generating, using a first measurement circuit that comprises a counter controlled by a gate signal having a gate signal period, a first estimate of an integer number of clock cycles of the first frequency signal within a respective gate signal period of the gate signal; generating, using a second measurement circuit comprising a time-to-digital converter (TDC) controlled by the gate signal, a second estimate of a fractional number of clock cycle of the first frequency signal within the respective gate signal period of the gate signal; adding, using a first adder circuit, the first estimate and the second estimate to generate a measured number of clock cycles within the respective gate signal period of the gate signal; generating, using a reference measurement circuit, a third estimate of an expected number of clock cycles within the respective gate signal period of the gate signal; and generating an estimate of a difference between the measured number of clock cycles and the expected number of clock cycles using a closed-loop frequency tracking circuit, wherein the closed-loop frequency tracking circuit is coupled to an output of the reference measurement circuit and an output of the first adder circuit.

Embodiments may achieve advantages as described below. In the disclosed embodiments, the frequency linearity measurement circuit includes a first measurement circuit for measuring the integer number of clock cycles of the measurement signal m(t) in each gate signal period, and includes a second measurement circuit for measuring the fractional number of clock cycles of the measurement signal m(t) in each gate signal period. The fractional number of clock cycles measured provides enhanced accuracy not achievable by designs that only measure the integer number of clock cycles of the measurement signal m(t). The closed-loop frequency tracking circuit functions as a closed-loop feedback control system to track the frequency error and provides an accurate estimate of the frequency error. By adjusting the bandwidth of the CIC filter in the closed-loop frequency tracking circuit, the first measurement circuit may be omitted from the frequency linearity measurement circuit for simplified hardware implementation. In addition, the disclosed measurement circuit and method can be used to measure the frequency linearity in real-time, while the chirp signal is being generated. Compared with designs where frequency linearity can only be measured infrequently, e.g., during dedicated calibration period, the presently disclosed embodiment allows real-time measurements at all time, which allows quick, real-time response by the controller to correct frequency non-linearity.

Examples of the present invention are summarized here. Other examples can also be understood from the entirety of the specification and the claims filed herein.

Example 1. In an embodiment, a radio-frequency integrated circuit (RFIC) includes: a phase-locked loop (PLL) configured to generate a frequency modulated signal under control of a control signal; a frequency divider circuit configured to divide a frequency of the frequency modulated signal to generate a first frequency signal, wherein a frequency of the first frequency signal is proportional to a frequency of the frequency modulated signal; and a frequency linearity measurement circuit configured to measure a frequency linearity of the frequency modulated signal while the frequency modulated signal is being generated by the PLL, the frequency linearity measurement circuit comprising: a first measurement circuit comprising a counter, wherein the counter is controlled by a gate signal having a gate signal period, wherein the first measurement circuit is configured to generate a first estimate of an integer number of clock cycles of the first frequency signal within a respective gate signal period of the gate signal; a second measurement circuit comprising a time-to-digital converter (TDC), wherein the TDC is controlled by the gate signal, and is configured to generate a second estimate of a fractional number of clock cycle of the first frequency signal within the respective gate signal period of the gate signal; a reference measurement circuit configured to generate a third estimate of an expected number of clock cycles within the respective gate signal period of the gate signal; and a closed-loop frequency tracking circuit configured to track a frequency error between an expected frequency and a measured frequency, wherein the expected frequency is determined based on the third estimate, and the measured frequency is determined based on a sum of the first estimate and the second estimate.

Example 2. The RFIC of Example 1, wherein the closed-loop frequency tracking circuit comprises: an accumulator configured to generate a phase error by accumulating the frequency error between the expected frequency and the measured frequency; and a frequency tracking controller coupled to an output of the accumulator and configured to generate an estimate of the frequency error, wherein the closed-loop frequency tracking circuit is configured to drive the phase error toward zero during operation.

Example 3. The RFIC of Example 2, wherein the frequency tracking controller is a proportional-integral (PI) control circuit.

Example 4. The RFIC of Example 2, further comprising: a quantizer coupled to an output of the reference measurement circuit and configured to quantize an output signal of the reference measurement circuit; a first subtractor circuit configured to compute a first difference between an output signal of the quantizer and an output signal of the frequency tracking controller; and a second subtractor circuit configured to compute a second difference between an output signal of the first subtractor circuit and the sum of the first estimate and the second estimate, wherein an output of the second subtractor circuit is coupled to an input of the accumulator.

Example 5. The RFIC of Example 4, wherein the quantizer has a control terminal and is configured to, based on a selection signal applied at the control terminal, quantize the output signal of the reference measurement circuit into a first data format having a first precision or a second data format having a second precision.

Example 6. The RFIC Example 5, further comprising a first cascaded integrator-comb (CIC) filter coupled between the accumulator and the frequency tracking controller.

Example 7. The RFIC of Example 6, further comprising an evaluation circuit configured to perform evaluation of the frequency error and the phase error.

Example 8. The RFIC of Example 7, further comprising a second CIC filter coupled between the evaluation circuit and the frequency tracking controller.

Example 9. The RFIC of Example 1, wherein the first estimate is generated by computing an average of the integer numbers of clock cycles of the first frequency signal counted over a first number of gate signal periods.

Example 10. The RFIC of Example 1, wherein the integer number of clock cycles of the first frequency signal within the respective gate signal period of the gate signal is the number of rising edges of the first frequency signal within the respective gate signal period, wherein the fractional number of clock cycle of the first frequency signal within the respective gate signal period corresponds to a time offset between a rising edge of the gate signal and a closest rising edge of the first frequency signal within the gate signal period scaled by a scaling factor.

Example 11. The RFIC of Example 10, wherein the scaling factor is proportional to the frequency of the first frequency signal.

Example 12. In an embodiment, a circuit for measuring a frequency linearity includes a first measurement circuit comprising: a counter, wherein a first input terminal of the counter is configured to receive a first frequency signal, wherein a second input terminal of the counter is configured to receive a gate signal having a gate signal period, wherein the counter is configured to count clock cycles of the first frequency signal and is configured to output a value of the counter at first edges of the gate signal; a first delay element coupled to an output of the counter and configured to store the output of the counter at a previous first edge of the gate signal; and a modulo circuit coupled to the output of the counter and an output of the first delay element, wherein the modulo circuit is configured to compute the number of clock cycles of the first frequency signal in a respective gate signal period. The circuit also includes a second measurement circuit comprising: a time-to-digital converter (TDC), wherein the TDC is configured to measure a time offset between the first edge of the gate signal and a corresponding first edge of the first frequency signal; a second delay element coupled to an output of the TDC and configured to store $N_{GATE}$ previous outputs of the TDC; a divider configured to divide a difference between an output signal of the TDC and an output signal of the second delay element by $N_{GATE}$; and a scaling circuit coupled to an output of the divider and configured to scale an output signal of the divider by a scaling factor. The circuit further includes: a first adder circuit configured to compute a sum of an output signal of the first measurement circuit and an output signal of the second measurement circuit; and a reference measurement circuit configured to calculate a reference signal indicating an expected number of clock cycles in the gate signal period.

Example 13. The circuit of Example 12, further comprising a closed-loop frequency tracking circuit coupled to an output of the first adder circuit and an output of the reference measurement circuit, wherein the closed-loop frequency tracking circuit is configured to track an error between the reference signal and an output signal of the first adder circuit.

Example 14. The circuit of Example 13, wherein the closed-loop frequency tracking circuit comprises: an accumulator; a frequency tracking controller coupled to an output of the accumulator; a first subtractor circuit configured to compute a first difference between an output signal of the reference measurement circuit and an output signal of the frequency tracking controller; and a second subtractor circuit configured to compute a second difference between an output signal of the first subtractor circuit and the output signal of the first adder circuit, wherein an output of the second subtractor circuit is coupled to an input of the accumulator, wherein the frequency tracking controller is configured to generate an estimate of the error between the reference signal and the output signal of the first adder circuit.

Example 15. The circuit of Example 14, wherein the frequency tracking controller comprises a proportional-integral (PI) control circuit, wherein the closed-loop frequency tracking circuit is configured to drive an output signal of the accumulator toward zero during operation.

Example 16. The circuit of Example 12, wherein the first measurement circuit further comprises a first averaging circuit coupled to the modulo circuit, wherein the first averaging circuit is configured to compute a first average of $N_{GATE}$ consecutive outputs of the modulo circuit.

Example 17. The circuit of Example 12, wherein the first edges of the gate signal are rising edges of the gate signal, and wherein the counter is configured to count the clock cycles of the first frequency signal by counting the number of rising edges of the first frequency signal, wherein the corresponding first edge of the first frequency signal is a closest rising edge of the first frequency signal at or after the rising edge of the gate signal.

Example 18. The circuit of Example 12, wherein a maximum output value of the counter is $N_{MAX}$-1, and wherein after counting to $N_{MAX}$-1, the counter value goes to zero at a next increment of the counter value, wherein the modulo circuit is configured to compute the number of clock cycles of the first frequency signal in the respective gate signal period by performing a modulo operation mod(B–A, $N_{MAX}$), where B is the output of the counter, and A is the output of the first delay element.

Example 19. In an embodiment, a method of operating a radio-frequency integrated circuit (RFIC) includes: generating a frequency modulated signal using a phase-locked loop (PLL) of the RFIC; and measuring a frequency linearity of the frequency modulated signal while the frequency modulated signal is being generated by the PLL, comprising: frequency dividing the frequency modulated signal to generate a first frequency signal; generating, using a first measurement circuit that comprises a counter controlled by a gate signal having a gate signal period, a first estimate of an integer number of clock cycles of the first frequency signal within a respective gate signal period of the gate signal; generating, using a second measurement circuit comprising a time-to-digital converter (TDC) controlled by the gate signal, a second estimate of a fractional number of clock cycle of the first frequency signal within the respective gate signal period of the gate signal; adding, using a first adder circuit, the first estimate and the second estimate to generate a measured number of clock cycles within the respective gate signal period of the gate signal; generating, using a reference measurement circuit, a third estimate of an expected number of clock cycles within the respective gate signal period of the gate signal; and generating an estimate of a difference between the measured number of clock cycles and the expected number of clock cycles using a closed-loop frequency tracking circuit, wherein the closed-loop frequency tracking circuit is coupled to an output of the reference measurement circuit and an output of the first adder circuit.

Example 20. The method of Example 19, wherein the integer number of clock cycles of the first frequency signal within the respective gate signal period of the gate signal is the number of rising edges of the first frequency signal within the respective gate signal period, wherein the fractional number of clock cycle of the first frequency signal within the respective gate signal period corresponds to a time offset between a rising edge of the gate signal and a closest rising edge of the first frequency signal within the gate signal period scaled by a scaling factor, wherein the scaling factor is proportional to the frequency of the first frequency signal.

While this invention has been described with reference to illustrative examples, this description is not intended to be construed in a limiting sense. Various modifications and combinations of the illustrative examples, as well as other examples of the invention, will be apparent to persons skilled in the art upon reference to the description. It is therefore intended that the appended claims encompass any such modifications or examples.

What is claimed is:

1. A radio-frequency integrated circuit (RFIC) comprising:
   a phase-locked loop (PLL) configured to generate a frequency modulated signal under control of a control signal;
   a frequency divider circuit configured to divide a frequency of the frequency modulated signal to generate a first frequency signal, wherein a frequency of the first frequency signal is proportional to a frequency of the frequency modulated signal; and
   a frequency linearity measurement circuit configured to measure a frequency linearity of the frequency modulated signal while the frequency modulated signal is being generated by the PLL, the frequency linearity measurement circuit comprising:
      a first measurement circuit comprising a counter, wherein the counter is controlled by a gate signal having a gate signal period, wherein the first measurement circuit is configured to generate a first estimate of an integer number of clock cycles of the first frequency signal within a respective gate signal period of the gate signal;
      a second measurement circuit comprising a time-to-digital converter (TDC), wherein the TDC is controlled by the gate signal, and is configured to generate a second estimate of a fractional number of clock cycle of the first frequency signal within the respective gate signal period of the gate signal;

a reference measurement circuit configured to generate a third estimate of an expected number of clock cycles within the respective gate signal period of the gate signal; and a closed-loop frequency tracking circuit configured to track a frequency error between an expected frequency and a measured frequency, wherein the expected frequency is determined based on the third estimate, and the measured frequency is determined based on a sum of the first estimate and the second estimate.

2. The RFIC of claim 1, wherein the closed-loop frequency tracking circuit comprises:
an accumulator configured to generate a phase error by accumulating the frequency error between the expected frequency and the measured frequency; and
a frequency tracking controller coupled to an output of the accumulator and configured to generate an estimate of the frequency error, wherein the closed-loop frequency tracking circuit is configured to drive the phase error toward zero during operation.

3. The RFIC of claim 2, wherein the frequency tracking controller is a proportional-integral (PI) control circuit.

4. The RFIC of claim 2, further comprising:
a quantizer coupled to an output of the reference measurement circuit and configured to quantize an output signal of the reference measurement circuit;
a first subtractor circuit configured to compute a first difference between an output signal of the quantizer and an output signal of the frequency tracking controller; and
a second subtractor circuit configured to compute a second difference between an output signal of the first subtractor circuit and the sum of the first estimate and the second estimate, wherein an output of the second subtractor circuit is coupled to an input of the accumulator.

5. The RFIC of claim 4, wherein the quantizer has a control terminal and is configured to, based on a selection signal applied at the control terminal, quantize the output signal of the reference measurement circuit into a first data format having a first precision or a second data format having a second precision.

6. The RFIC of claim 5, further comprising a first cascaded integrator-comb (CIC) filter coupled between the accumulator and the frequency tracking controller.

7. The RFIC of claim 6, further comprising an evaluation circuit configured to perform evaluation of the frequency error and the phase error.

8. The RFIC of claim 7, further comprising a second CIC filter coupled between the evaluation circuit and the frequency tracking controller.

9. The RFIC of claim 1, wherein the first estimate is generated by computing an average of the integer numbers of clock cycles of the first frequency signal counted over a first number of gate signal periods.

10. The RFIC of claim 1, wherein the integer number of clock cycles of the first frequency signal within the respective gate signal period of the gate signal is the number of rising edges of the first frequency signal within the respective gate signal period, wherein the fractional number of clock cycle of the first frequency signal within the respective gate signal period corresponds to a time offset between a rising edge of the gate signal and a closest rising edge of the first frequency signal within the gate signal period scaled by a scaling factor.

11. The RFIC of claim 10, wherein the scaling factor is proportional to the frequency of the first frequency signal.

12. A circuit for measuring a frequency linearity, the circuit comprising:
a first measurement circuit comprising:
a counter, wherein a first input terminal of the counter is configured to receive a first frequency signal, wherein a second input terminal of the counter is configured to receive a gate signal having a gate signal period, wherein the counter is configured to count clock cycles of the first frequency signal and is configured to output a value of the counter at first edges of the gate signal;
a first delay element coupled to an output of the counter and configured to store, at a first edge of the gate signal, the output of the counter; and
a modulo circuit coupled to the output of the counter and an output of the first delay element, wherein the modulo circuit is configured to compute the number of clock cycles of the first frequency signal in a respective gate signal period;
a second measurement circuit comprising:
a time-to-digital converter (TDC), wherein the TDC is configured to measure a time offset between the first edge of the gate signal and a corresponding first edge of the first frequency signal;
a second delay element coupled to an output of the TDC and configured to store $N_{GATE}$ previous outputs of the TDC;
a divider configured to divide a difference between an output signal of the TDC and an output signal of the second delay element by $N_{GATE}$; and
a scaling circuit coupled to an output of the divider and configured to scale an output signal of the divider by a scaling factor;
a first adder circuit configured to compute a sum of an output signal of the first measurement circuit and an output signal of the second measurement circuit; and
a reference measurement circuit configured to calculate a reference signal indicating an expected number of clock cycles in the gate signal period.

13. The circuit of claim 12, further comprising a closed-loop frequency tracking circuit coupled to an output of the first adder circuit and an output of the reference measurement circuit, wherein the closed-loop frequency tracking circuit is configured to track an error between the reference signal and an output signal of the first adder circuit.

14. The circuit of claim 13, wherein the closed-loop frequency tracking circuit comprises:
an accumulator;
a frequency tracking controller coupled to an output of the accumulator;
a first subtractor circuit configured to compute a first difference between an output signal of the reference measurement circuit and an output signal of the frequency tracking controller; and
a second subtractor circuit configured to compute a second difference between an output signal of the first subtractor circuit and the output signal of the first adder circuit, wherein an output of the second subtractor circuit is coupled to an input of the accumulator, wherein the frequency tracking controller is configured to generate an estimate of the error between the reference signal and the output signal of the first adder circuit.

15. The circuit of claim 14, wherein the frequency tracking controller comprises a proportional-integral (PI) control circuit, wherein the closed-loop frequency tracking circuit is configured to drive an output signal of the accumulator toward zero during operation.

16. The circuit of claim 12, wherein the first measurement circuit further comprises a first averaging circuit coupled to the modulo circuit, wherein the first averaging circuit is configured to compute a first average of $N_{GATE}$ consecutive outputs of the modulo circuit.

17. The circuit of claim 12, wherein the first edges of the gate signal are rising edges of the gate signal, and wherein the counter is configured to count the clock cycles of the first frequency signal by counting the number of rising edges of the first frequency signal, wherein the corresponding first edge of the first frequency signal is a closest rising edge of the first frequency signal at or after the rising edge of the gate signal.

18. The circuit of claim 12, wherein a maximum output value of the counter is $N_{MAX}-1$, and wherein after counting to $N_{MAX}-1$, the counter value goes to zero at a next increment of the counter value, wherein the modulo circuit is configured to compute the number of clock cycles of the first frequency signal in the respective gate signal period by performing a modulo operation $mod(B-A, N_{MAX})$, where B is the output of the counter, and A is the output of the first delay element.

19. A method of operating a radio-frequency integrated circuit (RFIC), the method comprising:
  generating a frequency modulated signal using a phase-locked loop (PLL) of the RFIC; and
  measuring a frequency linearity of the frequency modulated signal while the frequency modulated signal is being generated by the PLL, comprising:
    frequency dividing the frequency modulated signal to generate a first frequency signal;
    generating, using a first measurement circuit that comprises a counter controlled by a gate signal having a gate signal period, a first estimate of an integer number of clock cycles of the first frequency signal within a respective gate signal period of the gate signal;
    generating, using a second measurement circuit comprising a time-to-digital converter (TDC) controlled by the gate signal, a second estimate of a fractional number of clock cycle of the first frequency signal within the respective gate signal period of the gate signal;
    adding, using a first adder circuit, the first estimate and the second estimate to generate a measured number of clock cycles within the respective gate signal period of the gate signal;
    generating, using a reference measurement circuit, a third estimate of an expected number of clock cycles within the respective gate signal period of the gate signal; and
    generating an estimate of a difference between the measured number of clock cycles and the expected number of clock cycles using a closed-loop frequency tracking circuit, wherein the closed-loop frequency tracking circuit is coupled to an output of the reference measurement circuit and an output of the first adder circuit.

20. The method of claim 19, wherein the integer number of clock cycles of the first frequency signal within the respective gate signal period of the gate signal is the number of rising edges of the first frequency signal within the respective gate signal period, wherein the fractional number of clock cycle of the first frequency signal within the respective gate signal period corresponds to a time offset between a rising edge of the gate signal and a closest rising edge of the first frequency signal within the gate signal period scaled by a scaling factor, wherein the scaling factor is proportional to the frequency of the first frequency signal.

* * * * *